United States Patent
Scharf et al.

[19]

[11] Patent Number: 6,144,034
[45] Date of Patent: Nov. 7, 2000

[54] DELAY CALIBRATION FOR GAMMA CAMERA TIMING CIRCUIT

[75] Inventors: Thomas E. Scharf, San Jose; Michael J. Petrillo, Pleasanton, both of Calif.

[73] Assignee: ADAC Laboratories, Milpitas, Calif.

[21] Appl. No.: 09/120,993

[22] Filed: Jul. 22, 1998

[51] Int. Cl.[7] .............................. G01T 1/166; H03K 5/22
[52] U.S. Cl. ............................................. 250/369; 327/23
[58] Field of Search ................................. 327/27, 24, 23; 250/369

[56] References Cited

U.S. PATENT DOCUMENTS 4,421,986  12/1983  Friauf et al. ........................... 250/369
5,841,140  11/1998  McCroskey et al. ............. 250/363.03

FOREIGN PATENT DOCUMENTS 94 19868 A1   9/1994   WIPO ...................................... 327/23

OTHER PUBLICATIONS

Wong, W.H. et al., "A Scintillation Detector Signal Processing Technique with Active Pileup Prevention for Extending Scintillation Count Rates," *IEEE Transactions on Nuclear Science*, Jun. 1998, v. 45, No. 3, pp. 838–842.

*Primary Examiner*—Constantine Hannaher
*Attorney, Agent, or Firm*—Blakely, Sokoloff, Taylor & Zafman LLP

[57] ABSTRACT

A method and apparatus for calibrating a programmable delay in a timing circuit of a gamma camera detector are provided. The programmable delay has an error, the value of which is to be determined. An input signal that is applied as input to the programmable delay is simultaneously applied as input to a precision fixed delay. The fixed delay has a delay value within the programmable range of the programmable delay, but has an error that is substantially smaller than that of the programmable delay. The output of the programmable delay is applied to one input of a decision circuit, and the output of the fixed delay is applied to another input of the decision circuit. The delay of the programmable delay is initially programmed to a value that is substantially greater than the delay of the fixed delay, and input pulses are then applied to both delays. The delay value of the programmable delay is progressively decreased as input pulses are applied, until the output of the decision circuit indicates that the outputs of both delays are asserted concurrently. The error of the programmable delay is then computed based upon the programmed delay value. The programmable delay is then reprogrammed with a new delay value, based on the computed error, to achieve a desired delay value during normal operation of the timing circuit.

24 Claims, 14 Drawing Sheets

DELAY CALIBRATION FOR GAMMA CAMERA TIMING CIRCUIT

FIELD OF THE INVENTION

The present invention pertains to the field of nuclear medicine. More particularly, the present invention relates to the calibration of delays in a timing circuit of a gamma camera detector.

BACKGROUND OF THE INVENTION

In a nuclear medicine imaging system that is capable of coincidence imaging, a key issue is how to identify coincidence events with high accuracy. Coincidence events may be detected by applying scintillation event based trigger pulses from each of two opposing gamma camera detectors to a timing circuit. The timing circuit determines whether two pulses, one from each detector, both occurred during a period of time known as a "coincidence timing window". A key design concern is to control the duration of the coincidence timing window. Variations in the duration of the coincidence timing window may cause inaccuracies in the images generated by the system.

With the above-mentioned approach, the duration of the trigger pulses that are input to the timing circuit may dictate the duration of the coincidence timing window. Consequently, control of the duration of the trigger pulses becomes critical. The trigger pulses, which represent scintillation events, tend to have durations of only a few nanoseconds. The electronics which generate and detect such pulses include inherent propagation delays in this same range and may also include various additional delays that have been included in the system by design. Accordingly, the delays of the electronics should have extremely small tolerances (errors), to avoid variations in the coincidence timing window. Even small variations in the delays in the electronic components may cause a noticeable variation in the width of the timing pulses.

Accordingly, there is a need to provide more precise control of the width of trigger pulses generated in a gamma camera system capable of coincidence imaging. More particularly, there is a need for more precise control of timing circuit delays in such a system.

SUMMARY OF THE INVENTION

A method and apparatus for calibrating a delay are provided. An input signal is delayed by a first delay to produce a first delayed signal and delayed by a second delay to produce a second delayed signal. A predetermined signal corresponding to a timing error between the first delayed signal and the second delayed signal is generated, and the first delay is adjusted based on the predetermined signal.

In particular embodiments, the method and apparatus may be applied to calibrate a timing circuit for generating an output in response to an input pulse edge. Also, in specific embodiments, the method and apparatus may be applied to calibrate a timing circuit within a detector of a gamma camera system for generating trigger pulses in response to scintillation events or other radiation-induced events.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A technique for calibrating a programmable delay in a timing circuit of a gamma camera detector is described. The technique can be implemented in a dedicated coincidence imaging system, such as a PET system, for example, or in a gamma camera system that is capable of both single-photon (SPECT) and coincidence imaging. Gamma camera systems with such dual PET/SPECT capability are available from ADAC Laboratories of Milpitas, Calif.

Briefly, the calibration technique is as follows. A delay provided by a programmable delay element has an error, the value of which is determined so that appropriate correction can be made. Accordingly, an input signal that is applied to the programmable delay element is also simultaneously applied as input to a precision fixed delay element. The fixed delay is within the programmable range of the programmable delay, and preferably near the low end of the range, but has an error that is substantially smaller than the error of the programmable delay. The output of the programmable delay element is applied to one input of a decision circuit, and the output of the fixed delay element is applied to another input of the decision circuit. The programmable delay is initially programmed to a value that is substantially greater than the fixed delay, and input pulses are then applied to both delay elements. The programmable delay is then progressively reduced as input pulses are applied, until the output of the decision circuit indicates that the outputs of both delay elements are asserted concurrently. The error between the programmed delay value and the true value of the programmed delay is then computed based upon the programmed delay value and the known value of the fixed delay. The programmable delay element is then reprogrammed with a new delay value, based on the error, to achieve the desired delay value.

Figure 1:
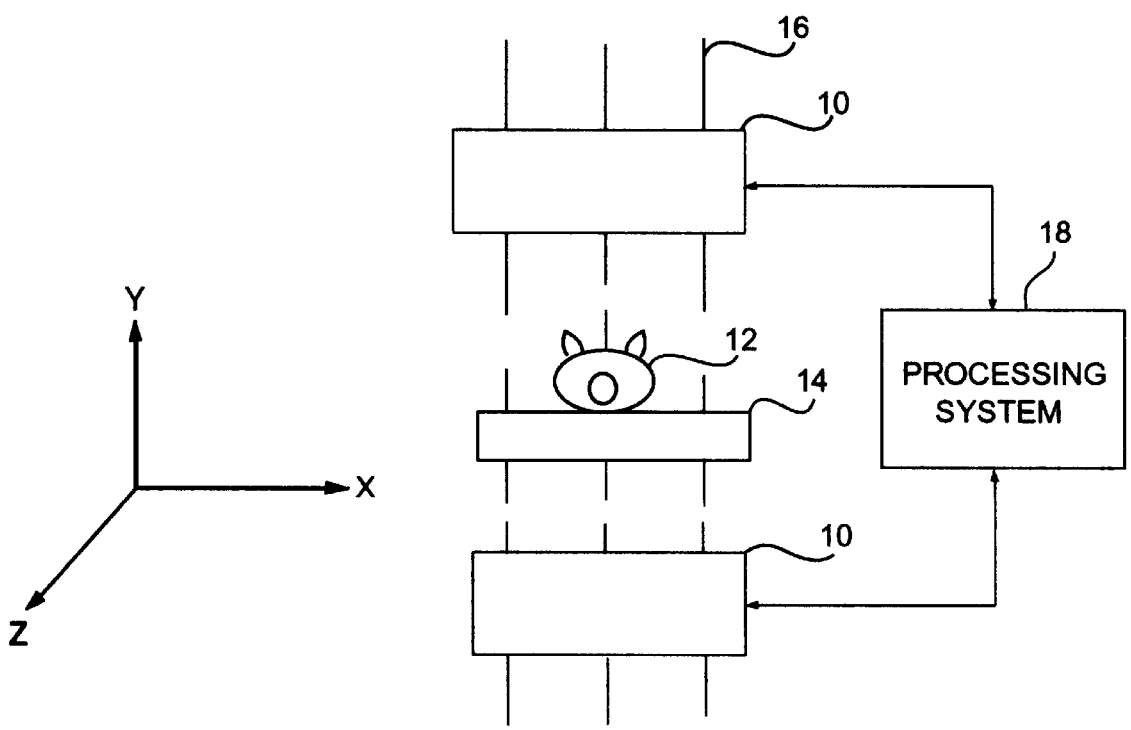
FIG. 1 is a block diagram of a gamma camera system.

FIG. 1 is a block diagram of a dual-detector gamma camera system capable of coincidence imaging, in which the calibration technique can be implemented. The system of FIG. 1 includes a processing system 18 coupled to two scintillation detectors 10. A gantry 16 supports the detectors 10. As will be described further below, each of the detectors 10 includes a scintillation crystal, an array of photomultiplier tubes (PMTs) optically coupled to the crystal, and appropriate processing circuit coupled to receive and process the outputs of the PMTs and to provide the processed outputs to the processing system 18. The detectors 10 are supported by a gantry that is capable of rotating the detectors 10, either individually or in unison, about an axis of rotation that is perpendicular to the x-y plane (parallel to the z axis). A patient 12 rests on a table 14 positioned between the detectors 10. The detectors 10 are configured for coincidence imaging, i.e., in a 180 degree orientation relative to each other about an axis of rotation that passes through the patient 12 parallel to the z axis.

Figure 2:
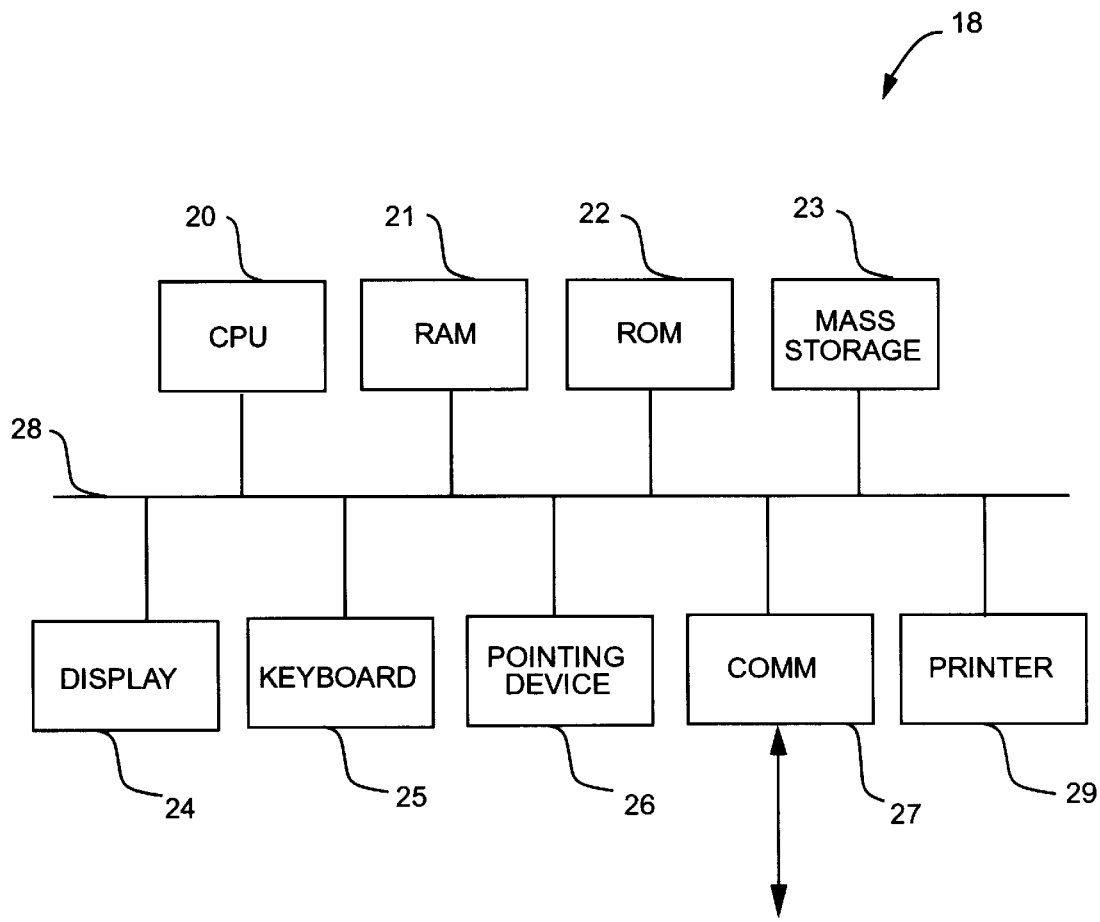
FIG. 2 is a block diagram of the processing system of the gamma camera system.

The processing system 18 controls the overall operation of the gamma camera system, including receiving data acquired by the detectors 10, processing the data, and reconstructing images based on the data. The processing system 18 may be, or may include, a conventional computer system, such as a personal computer (PC), a server and workstation, one or more single-board computers, or a combination of such devices. FIG. 2 illustrates a block diagram of the processing system 18 according to one embodiment.

In the illustrated embodiment of FIG. 2, the processing system 18 includes a central processing unit (CPU) 20, random access memory (RAM) 21, read-only memory (ROM) 22, and a mass storage device 23, each coupled to a bus system 28. The bus system 28 may represent multiple physical buses coupled together by appropriate bridges, controllers, and/or adapters. Also coupled to the bus system 28 are a display device (including appropriate display controller) 24, which may be a cathode ray tube (CRT), liquid crystal display (LCD), or the like; a keyboard 25; a pointing device 26, such as a mouse, trackball, touchpad, or the like; a data communication device 27; and a printer 29. Data communication device 27 may be used by processing system 18 to communicate with the detectors 10 and/or other computer systems or components and may be, for example, a simple transceiver, a network adapter, modem, or any other suitable data communication device. Display device 24 and printer 29 may be used to display and print, respectively, tomographic images reconstructed by processing system 18.

Figure 3:
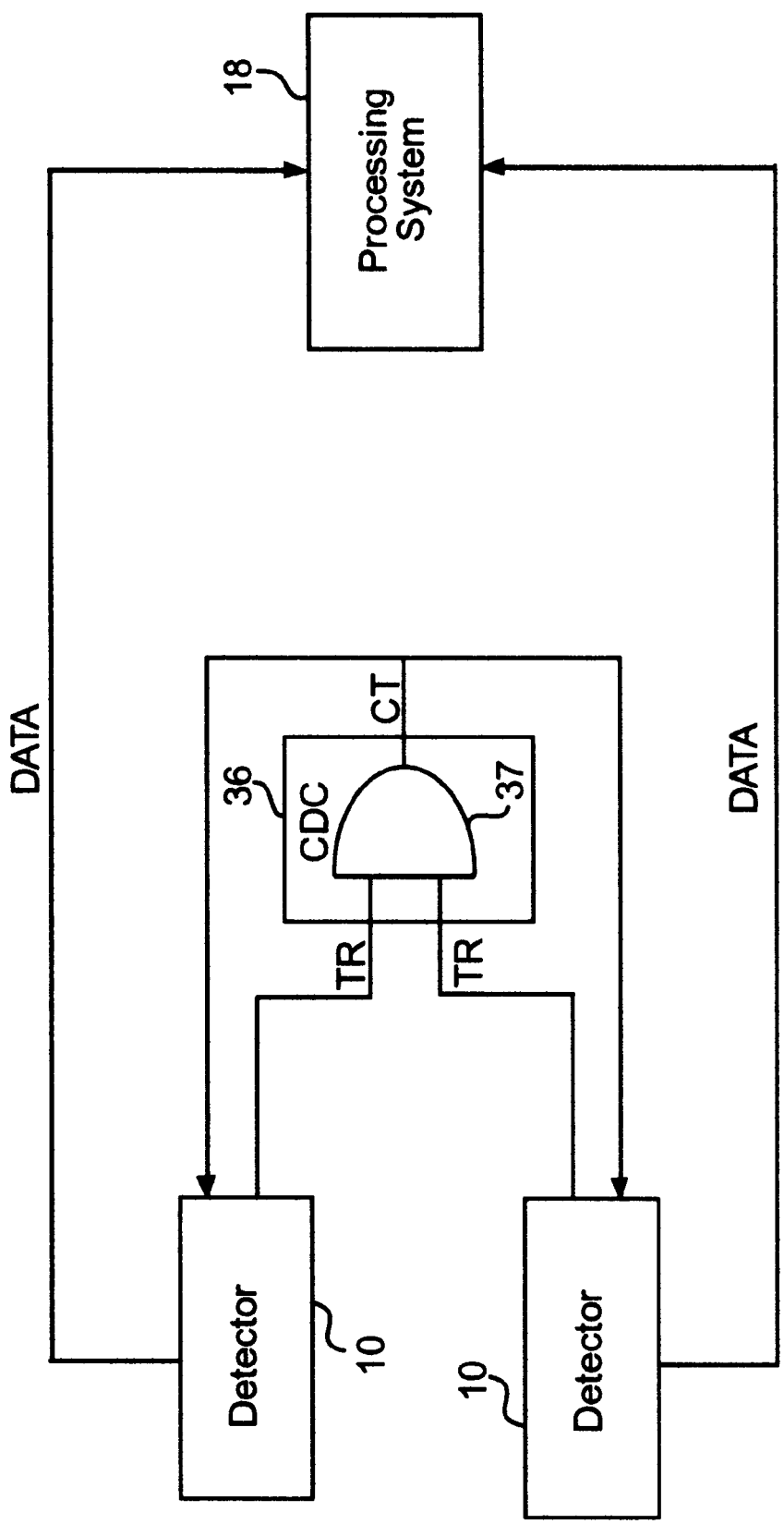
FIG. 3 illustrates coincidence detection circuitry (CDC) of the gamma camera system.

FIG. 3 illustrates the coincidence detection circuit of the gamma camera system, which enables the system to detect coincidence events. As shown, each of the detectors outputs trigger pulses via trigger signals TR in response to each detected scintillation event. The trigger signals TR from each detector are applied to the inputs of the coincidence detection circuit (CDC) 36, which outputs a coincidence trigger signal CT to each of the detectors 10. The CDC 36 may be a simple AND gate 37, as shown on FIG. 3. In response to assertion of the coincidence trigger signal CT, each of the detectors 10 registers the position and energy of the corresponding scintillation event. Position data (i.e., x,y coordinates) and energy data for registered events are provided by each of the detectors 10 to the processing system 18 via the DATA signals.

Figure 4:
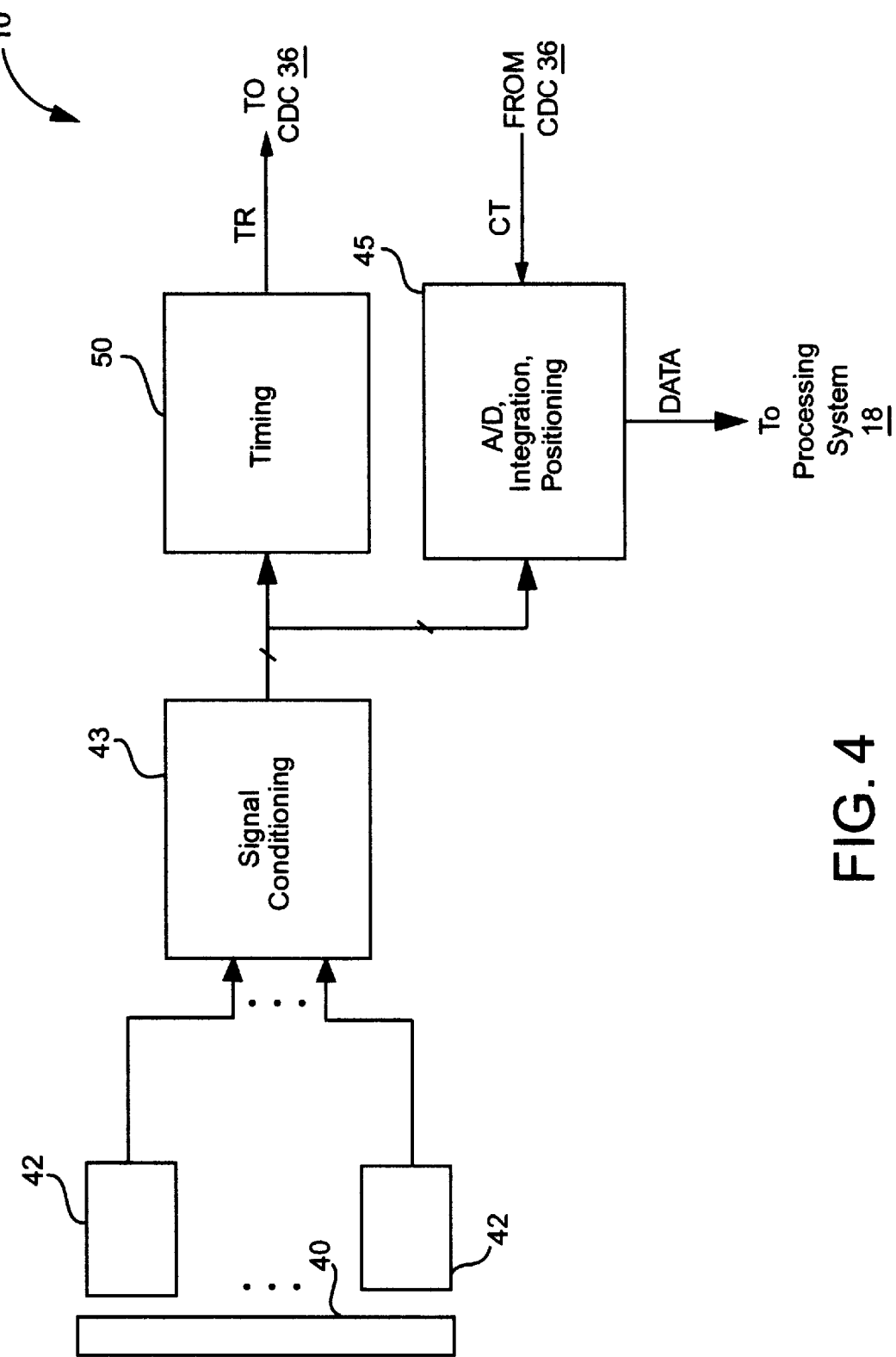
FIG. 4 illustrates internal components of a detector of the gamma camera system.

FIG. 4 is a high-level block diagram of the internal components of one of the detectors 10, according to one embodiment. The detectors 10 may be assumed to be identical for purposes of the present invention. The detector 10 includes a scintillation crystal 40, which is optically coupled to a number of PMTs 42. The outputs of the PMTs 42 are applied to signal conditioning circuit 43. The signal conditioning circuit 43 provides amplification of the PMT outputs and, if appropriate, other types of signal conditioning functions, the nature of which is not germane to the present invention. The signal conditioning circuit 43 outputs amplified channel signals corresponding to the PMT outputs to a timing circuit 50 and to analog-to-digital/integration/positioning (AIP) logic 45. The timing circuit 50 applies a signal-level threshold function to its inputs and generates trigger pulses TR for use by the CDC 36 for inputs that meet the threshold level. The timing circuit 50 may operate on individual PMT channel signals or signals representing multiple PMTs in aggregate (e.g., timing zones). The AIP logic 45 converts the amplified PMT outputs to digital values, performs integration of event pulses represented by those values, and computes position (x,y) coordinates for scintillation events. In response to assertion of the coincidence trigger CT from the CDC 36, the AIP circuit 45 registers the position and energy data for a corresponding scintillation event and provides the data to the processing system 18 via the DATA signal.

Figure 5A:
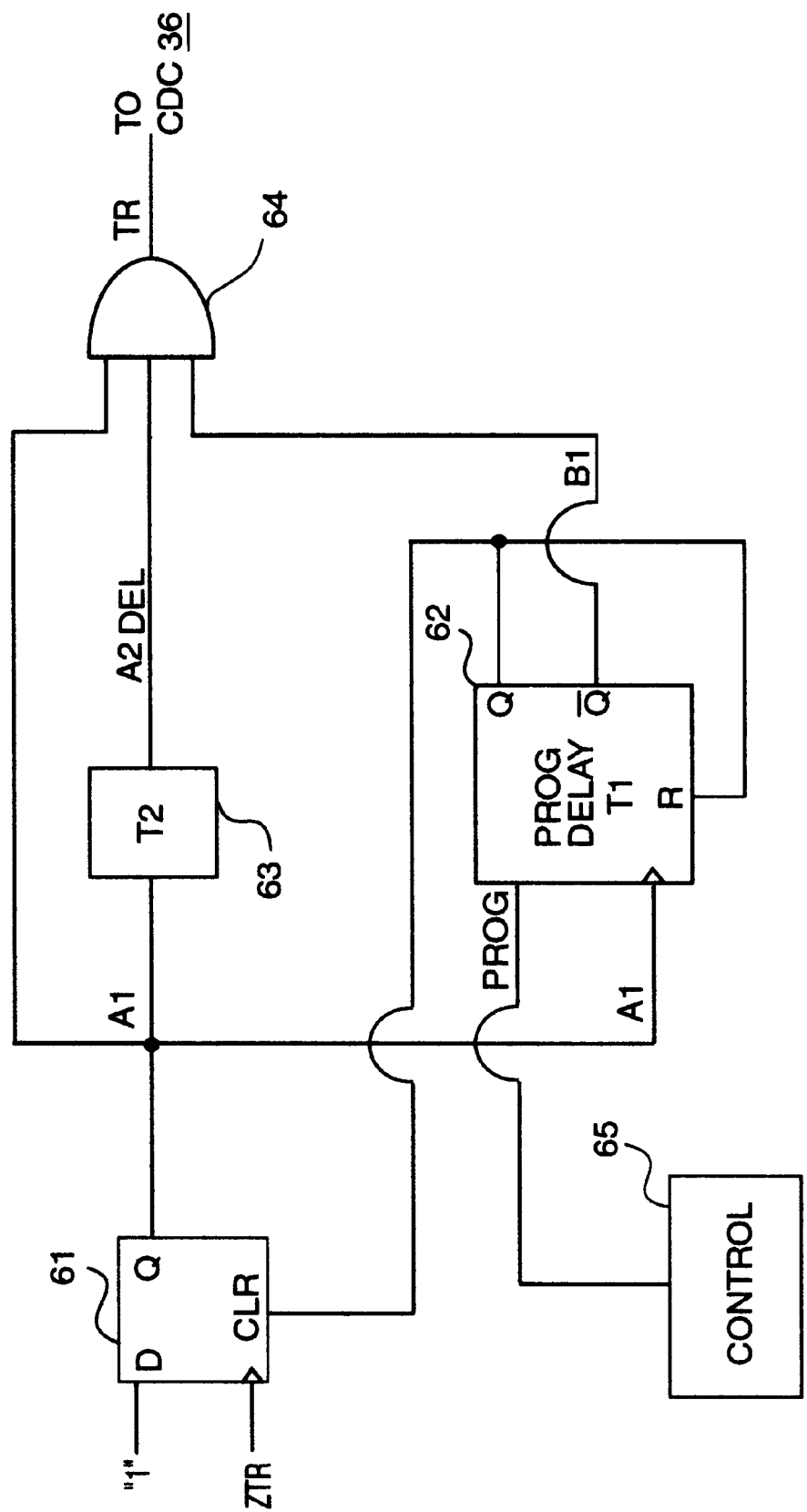
FIG. 5A illustrates trigger pulse generation circuitry of the timing circuit of the gamma camera system.

FIG. 5A illustrates circuitry for generating trigger pulses, which may be included within timing circuit 50. The circuitry of FIG. 5A is not equipped for delay calibration in accordance with the present invention. As shown, a trigger signal ZTR is applied to the clock input of a standard D type flip-flop 61. Trigger signal ZTR may represent either a single PMT channel or multiple PMT channels (e.g., a timing zone), m after appropriate thresholding has been applied. A logic "1" input is applied to the D input of the flip-flop 61. The Q output of flip-flop 61 outputs signal A1, which is applied to the input of a programmable delay element 62 and to the input of a fixed delay element 63. Programmable delay element 62 may be, for example, an AD 9500S programmable delay from Analog Devices, Inc. of Norwood, Mass. Fixed delay element 63 may be implemented, for example, as a known length of trace on a printed circuit board or as a known length of coaxial cable, which has a known velocity factor, or as a commercially available precision delay line. An example of a suitable programmable range of programmable delay element 62 is 0 to 30 nanoseconds. It may be desirable to set the maximum delay to the smallest practical value to maintain adjustment precision. Fixed delay element 63 provides partial compensation for the minimum inherent delay in programmable delay 62, i.e., the delay that nonetheless results when delay element 62 is programmed for no delay. The inclusion of fixed delay 63 in the circuit allows the circuit to generate pulses TR that are shorter in duration than this minimum inherent delay. Signal A1 is also applied to an input of an AND gate 64. The AND gate 64 also receives as input the output $A1_{DEL}$ of delay element 63, and the Q output of programmable delay element 62, which is designated as signal B1. The output of AND gate 64 is trigger signal TR, which is provided to the CDC 36. The $\overline{Q}$ output of programmable delay element 62 is applied to the CLEAR input of flip-flop 61, and is used to reset the $\overline{Q}$ output of flip-flop 61 (i.e., to deassert signal A1). The $\overline{Q}$ output of programmable delay element 62 is also applied to the RESET input of programmable delay 62 to reset the $\overline{Q}$ output. The value $T_1$ of the programmable delay is set by a control circuit 65 via signal PROG to a value that is longer than the delay $T_2$ of fixed delay element 63. Control circuit 65 may be, for example, a microprocessor, microcontroller, application-specific integrated circuit (ASIC), or a combination of such devices.

Figure 6A:
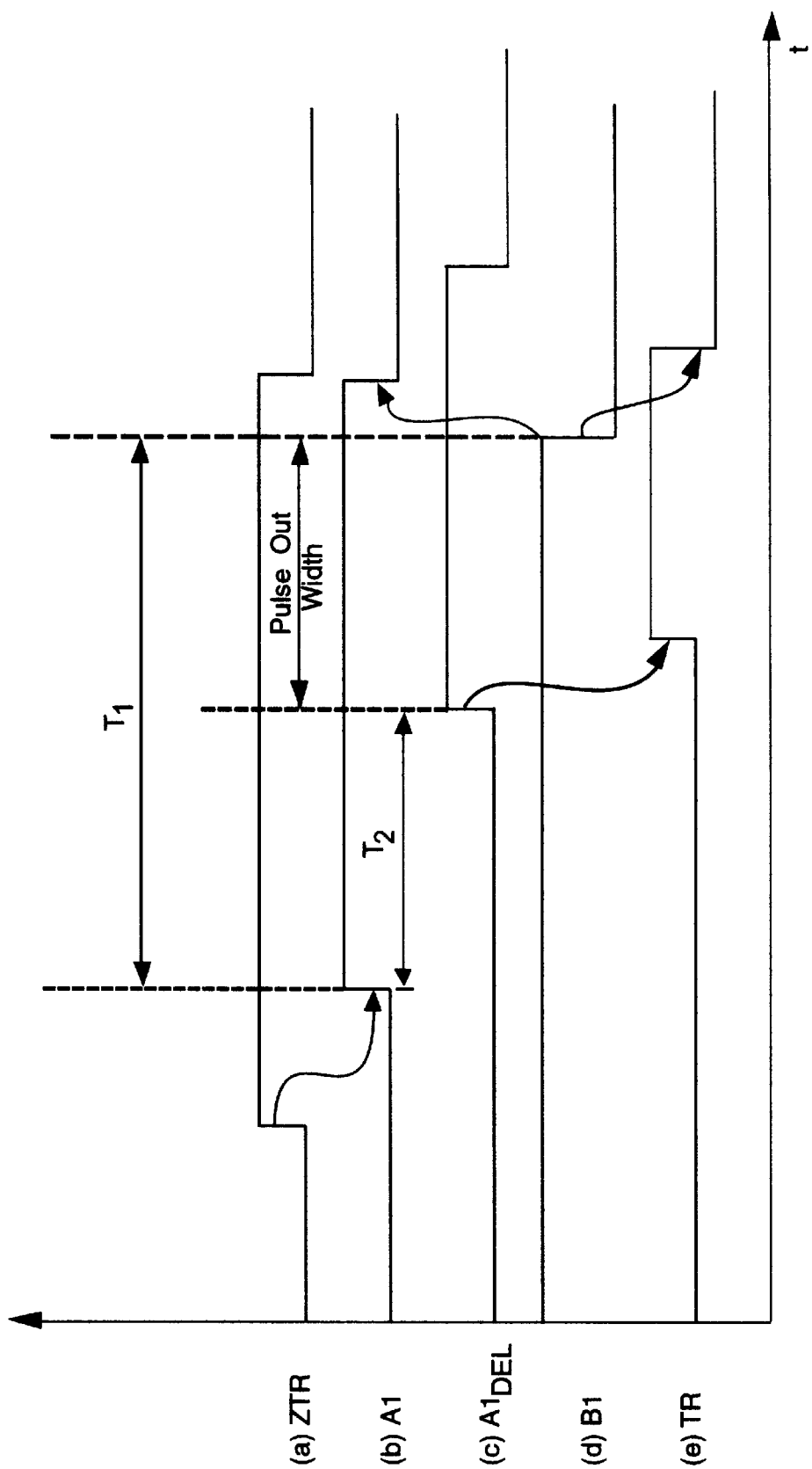
FIG. 6A is a timing diagram of signals associated with the trigger pulse generation circuitry of FIG. 5A.

The operation of the circuit of FIG. 5A will now be described with reference to the timing diagram of FIG. 6A. $T_1$ represents the duration of the programmable delay 62, while $T_2$ represents the duration of the fixed delay 63. A rising edge of signal ZTR causes a rising edge of signal A1. After a time $T_2$, following the rising edge of signal A1, a rising edge of signal A1$_{DEL}$ occurs. Note that signal B1 is initially in the asserted (high) state. In response to signal A1$_{DEL}$ being asserted, trigger signal TR is asserted. After a time $T_1$ following the rising edge of signal A1, signal B1 is deasserted. In response to the deasssertion of signal B1, signals TR and A1 are both deasserted. Thus, the leading edge of the output trigger TR pulse is generated by the same event that triggers the programmable delay element 62. The trailing edge of the TR pulse is generated by the timeout of programmable delay. Hence, the programmable delay is the primary source of error in the width of the TR pulse.

Hence, the duration of the trigger pulse TR that is applied to the CDC 36 is dependent upon the duration $T_1$ of the delay of programmable delay element 62. Any error between the programmed value and the true value of this delay will affect the width of the coincidence timing window, which is equal to twice the duration of the TR pulse in the above-described embodiment. Any variations in the width of this timing window contribute to inaccuracies in the imaging process. Therefore, it is desirable to have a technique for determining the amount of this error and for compensating for such error. The present invention provides such a technique.

Figure 5B:
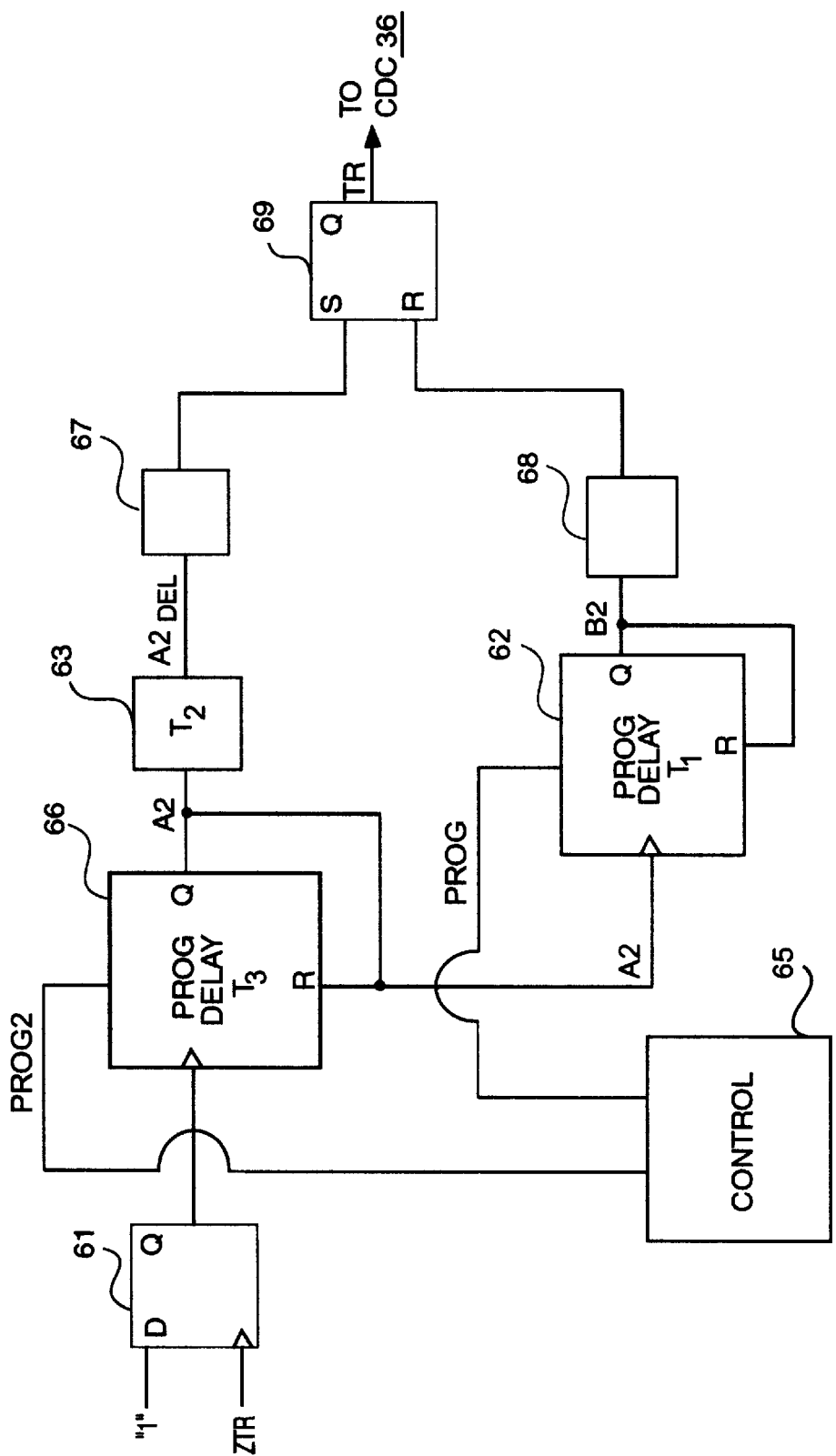
FIG. 5B illustrates alternative trigger pulse generation circuitry of the timing circuit of the gamma camera system.
Figure 6B:
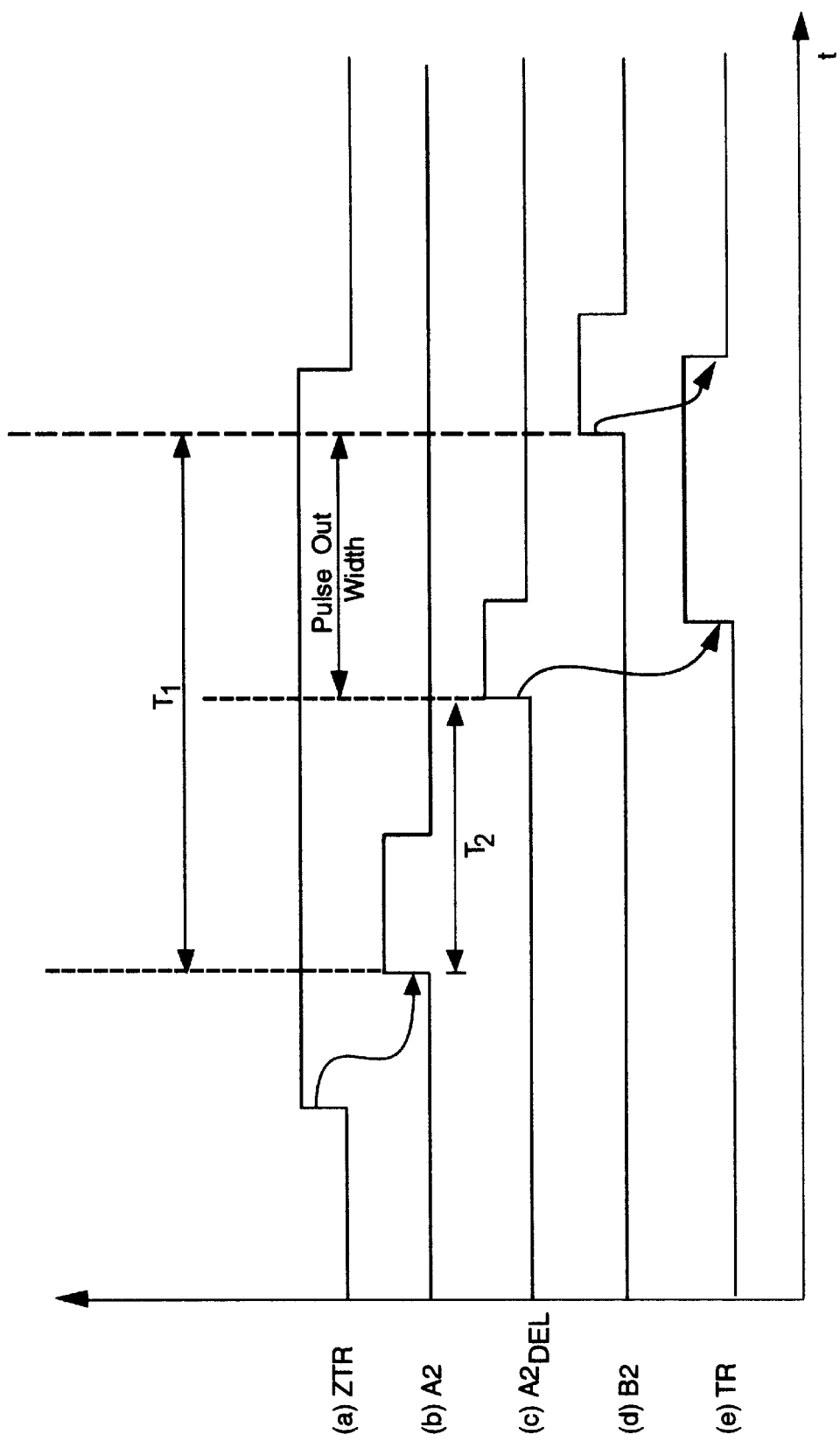
FIG. 6B is a timing diagram of signals associated with the trigger pulse generation circuitry FIG. 5B.

Before considering this technique, however, refer to FIG. 5B, which illustrates alternative circuitry for generating trigger pulses, which may be included within timing circuit 50. The circuitry of FIG. 5B is also not equipped for delay calibration in accordance with the present invention. As shown, the circuit of FIG. 5B includes a second programmable delay element 66 for providing a delay of duration $T_3$. The Q output of flip-flop 61 is provided to the input of the second programmable delay 66. The Q output of the programmable delay 66 is signal A2, which is provided to the input of fixed delay element 63 and to a RESET input of programmable delay element 66. In addition, signal A2 is also applied to the input of programmable delay element 62. Control circuit 65 provides a second programming signal PROG2 to the programmable delay 66 to program the value $T_3$ of the delay. The output A2$_{DEL}$ of delay 63 is applied to the input of a one shot 67. Similarly, the Q output of programmable delay 62, which is designated as signal B2 is applied to the input of another one shot 68 and to the RESET input of programmable delay 62. The output of one shot 67 is applied to the SET input of a set/reset flip-flop 69, while the output of one shot 68 is applied to the RESET input of flip-flop 69. The Q output of flip-flop 69 is the trigger signal TR, which is provided to the CDC 36. One shots 67 and 68 are used to control pulse widths to ensure proper operation of flip-flop 69, i.e., to convert the leading edge of each output pulse of programmable delays 66 and 62, respectively, to a pulse of a known duration. As in the circuit of FIG. 5A, the control circuit 65 provides a programming signal PROG to programmable delay 62 to set the value of programmable delay $T_1$. FIG. 6B provides a timing diagram of the signals associated with the circuit of FIG. 5B. Note that, as in the previous example, the duration of the trigger pulse TR is determined by the duration $T_1$ of the delay of programmable delay element 62.

Figure 7A:
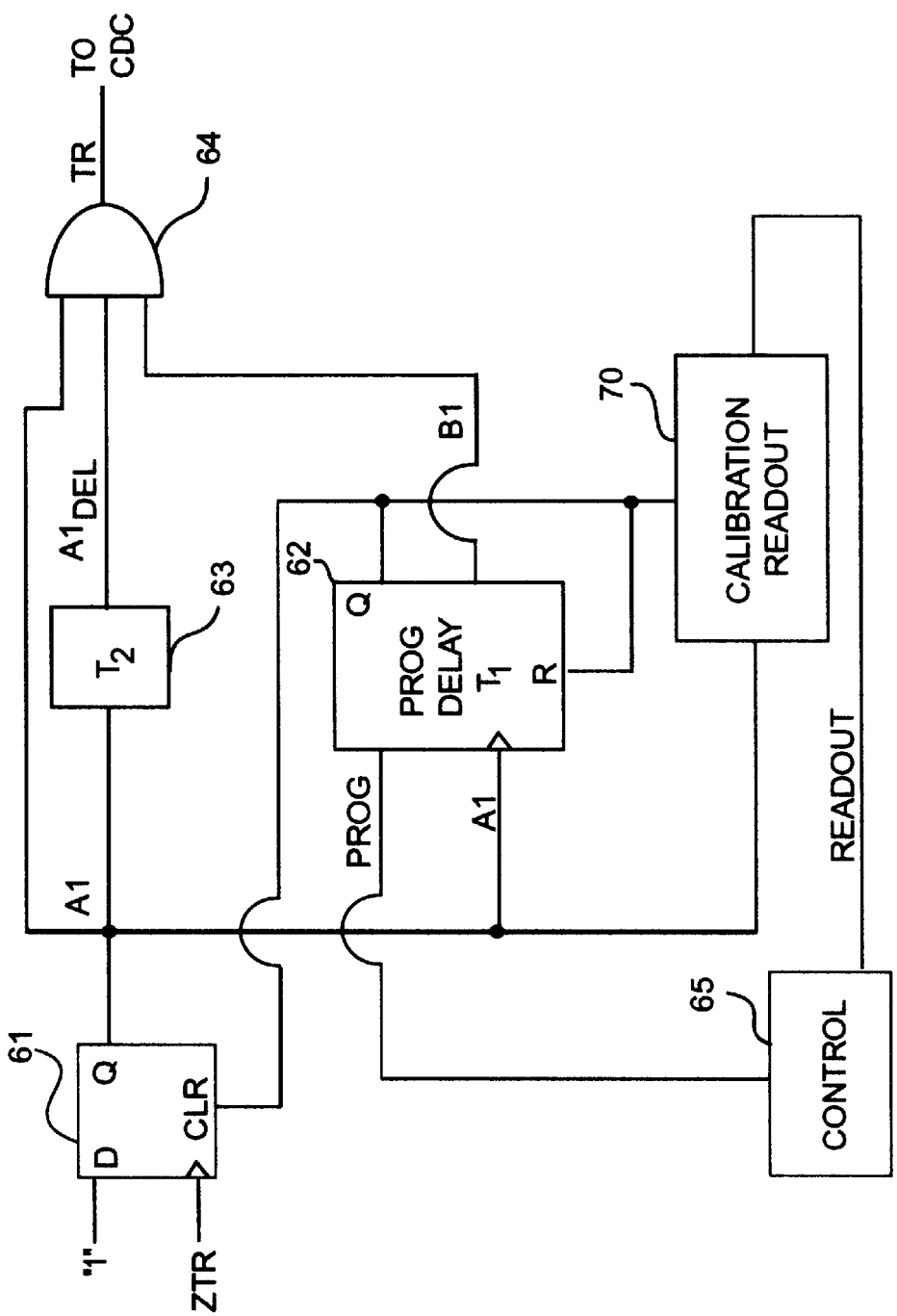
FIG. 7A illustrates trigger pulse generation circuitry having a delay calibration circuit according to one embodiment.
Figure 7B:
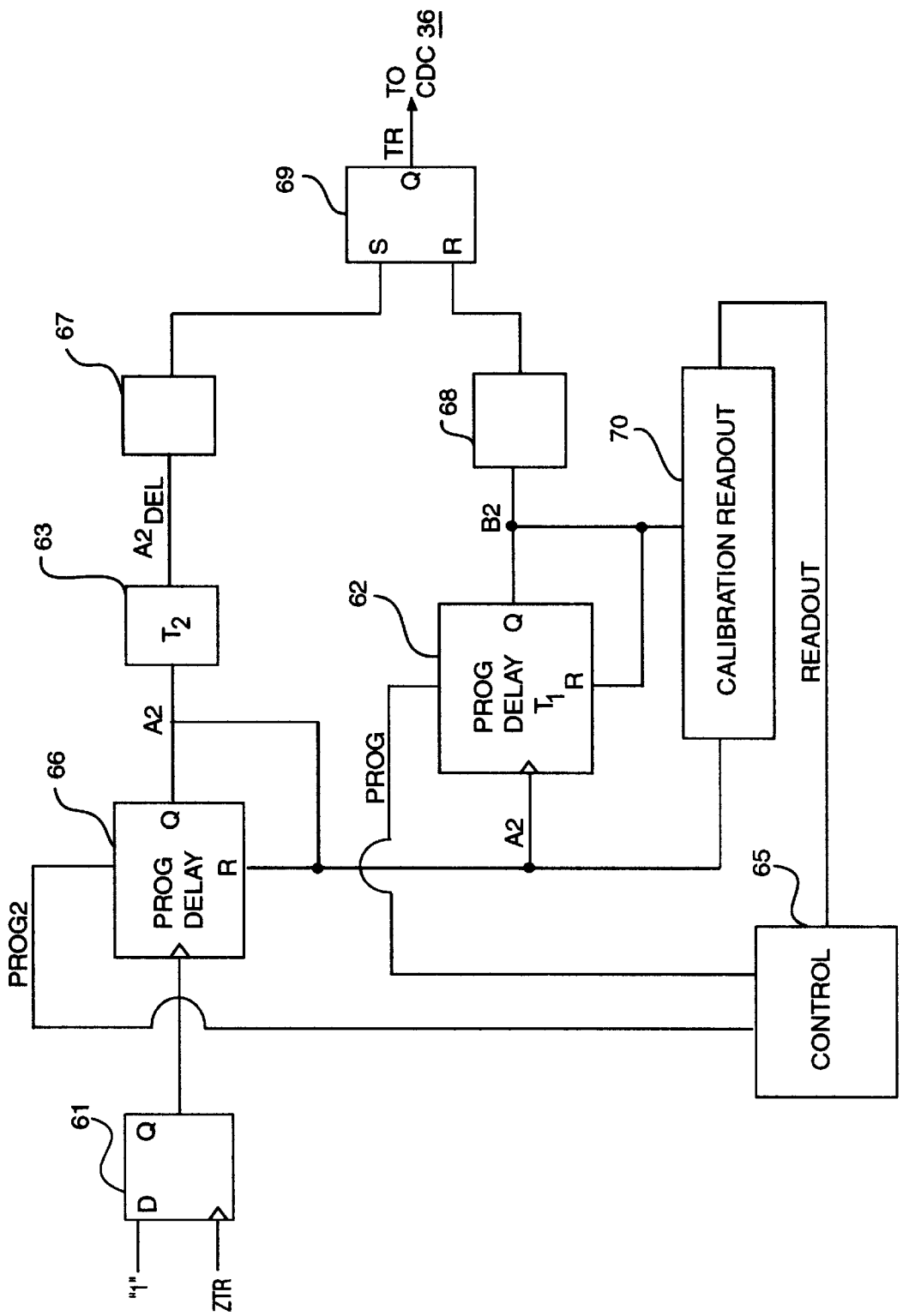
FIG. 7B illustrates trigger pulse generation circuitry having a delay calibration circuit according to another embodiment.

FIG. 7A illustrates how the trigger pulse generation circuitry can be modified, according to one embodiment, to implement the delay calibration technique of the present invention. The technique can be employed to determine the error of the programmable delay, so that appropriate correction can be applied. The circuit of FIG. 7A is similar to the circuit of FIG. 5A, however, a calibration readout circuit 70 has been added. The calibration readout circuit 70 receives as input the signal A1 output from flip-flop 61 and the Q output of programmable delay element 62 and provides an output signal READOUT to the control circuit 65. The control circuit 65 uses the READOUT signal compute the value of the error of the delay of programmable delay element 62. Once the value of the error is computed, the control circuit 65 computes the duration $T_1$. of programmable delay that is required, based on the error, to produce the desired delay. The control circuit 65 then provides the programming signal PROG to programmable delay element 62 to set the value $T_1$ of the delay FIG. 7B illustrates another embodiment, which is similar to the circuit of FIG. 5B, however, a calibration readout circuit 70 has been added. In the embodiment of FIG. 7B, the calibration readout circuit 70 receives as input signal A2 from programmable delay element 66 and signal B2 output from programmable delay 62.

Figure 8:
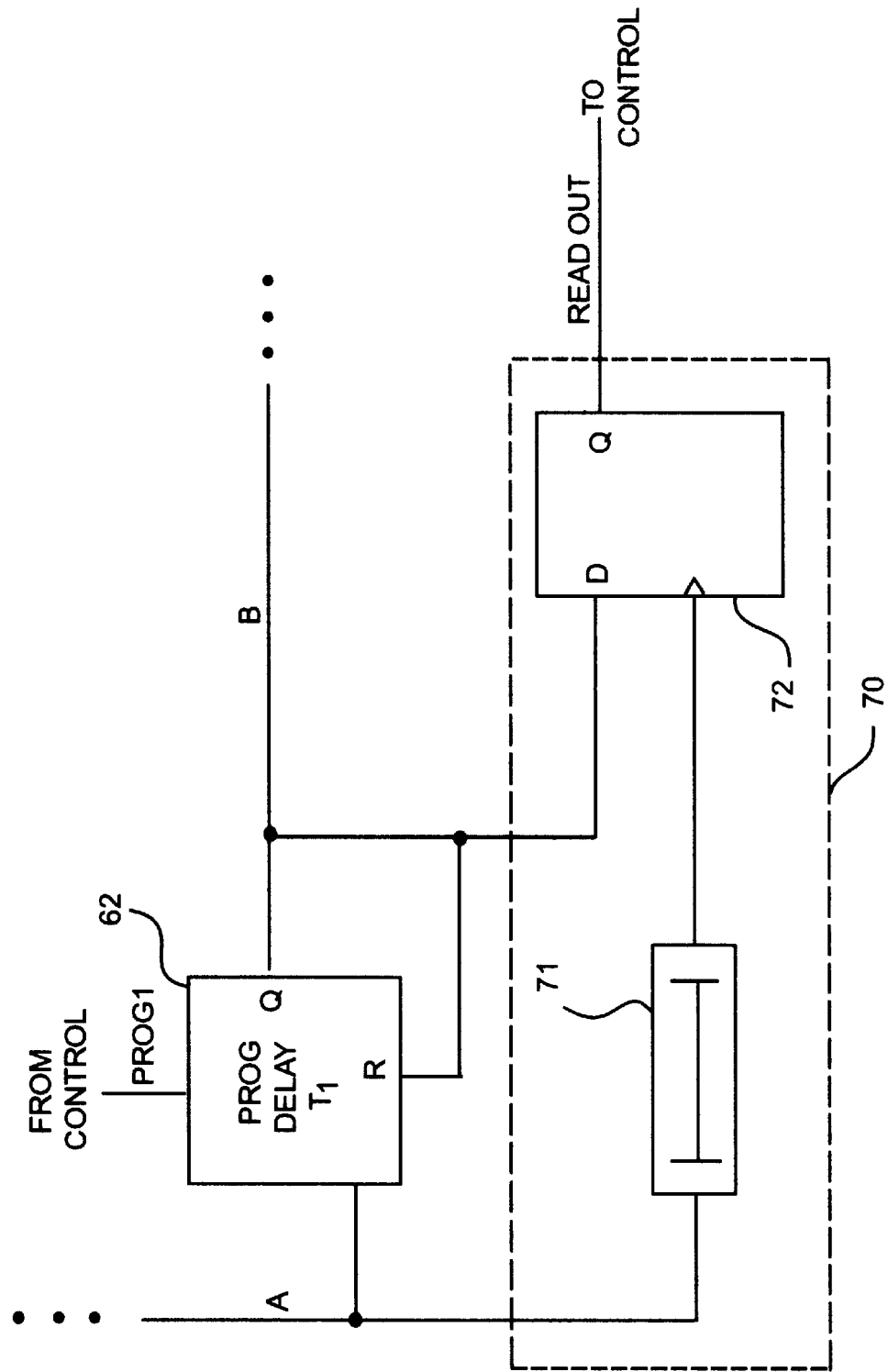
FIG. 8 illustrates the delay calibration circuit according to one embodiment.

FIG. 8 illustrates the calibration readout circuit 70 in greater detail, according to one embodiment. Signal A represents either signal A1 or A2, described above, while signal B represents either signal B1 or B2. As shown, the calibration readout circuit 70 includes a precision fixed delay element 71 and a D type flip-flop 72. Fixed delay element 71 is a "precision" delay element in that it has a tolerance that is much smaller than that of programmable delay element 62. Thus, any error in the delay of fixed delay 71 is much smaller than that of programmable delay element 62. Fixed delay element 71 may be implemented, for example, as a known length of trace on a printed circuit board or as a known length of coaxial cable, which has a known velocity factor, or as a commercially available precision delay line. The delay value of fixed delay element 71 is chosen to be within the programmable range of programmable delay element 62 and preferably toward the low end of that range.

Signal A is applied to the input of fixed delay element 71. The output of fixed delay element 71 is applied to the clock input of flip-flop 72. The D input of flip-flop 72 receives signal B, which is the Q output of programmable delay element 62. The Q output of flip-flop 72 is the READOUT signal provided to control circuit 65, as described above.

The delay calibration circuit 70 is operated by initially programming the delay $T_1$ of programmable delay element 62 to a value that is known to be greater than the delay of fixed delay element 71. The delay value $T_1$ is then progressively reduced ("swept back") through reprogramming, as input trigger pulses are applied, until a rising edge appears on the READOUT signal. Such a rising edge indicates that the actual value of the programmable delay is substantially equal to the delay of fixed delay element 71. Thus, when the READOUT signal is asserted, the actual value of the delay of programmable delay element 62 is known with relatively high accuracy. The error of programmable delay element 62 is computed as the difference between the programmed delay value and the delay of the fixed delay element 71. Accordingly, control circuit 65 computes the programmed delay value that is required to produce the desired delay given the computed error, which is the desired delay plus or minus the computed error, as appropriate.

Referring again to FIG. 7A, note that precision fixed delay element 63 may be the source of a very small error in the leading edge of the TR pulse. The accuracy of calibration is determined by the error in precision fixed delay element 71 and the set up and hold time window of the calibration flip-flop 72. With careful part selection, however, the sum of these errors can be kept to a value that is insignificant for purposes of the present invention.

Figure 9:
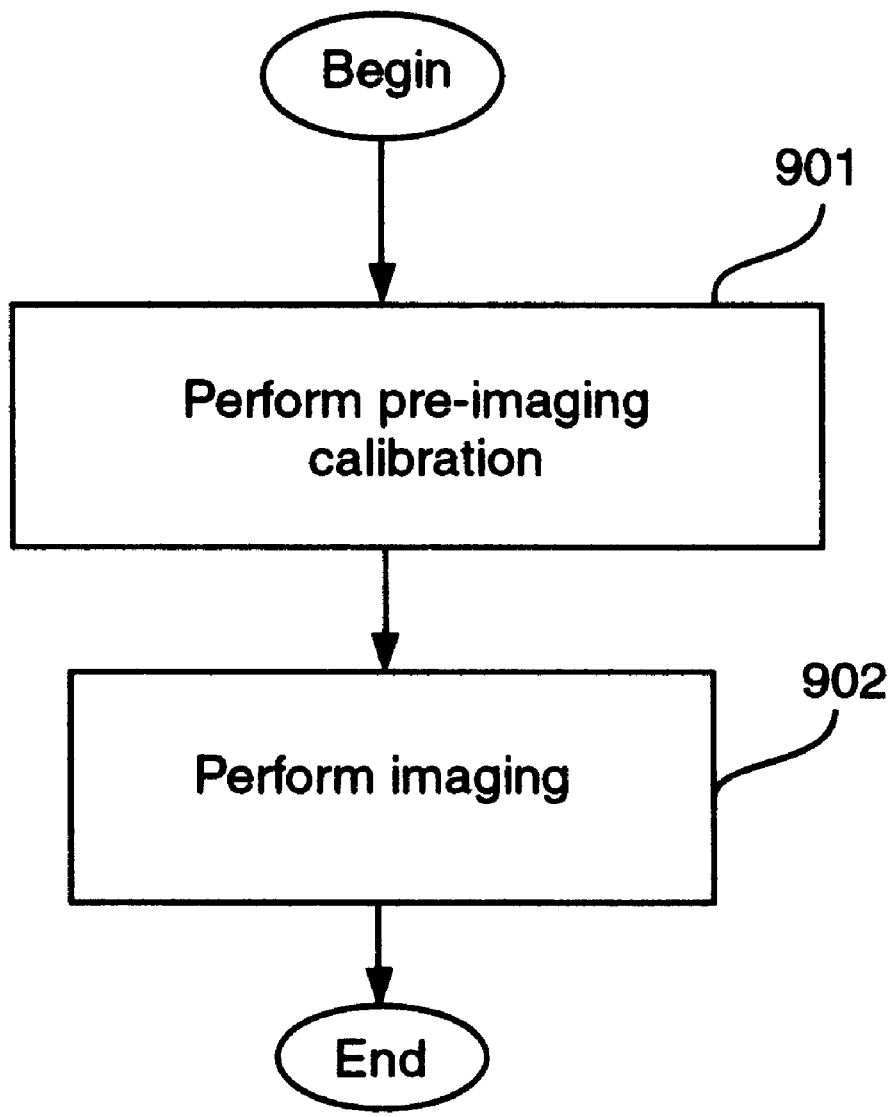
FIG. 9 is a flow diagram showing a relationship between the calibration and imaging processes

The calibration procedure described above (901) is preferably performed prior to an imaging session (902), as indicated by FIG. 9. More specifically, the calibration is preferably performed prior to the first clinical use of the system and is subsequently performed from time to time to maintain proper calibration.

Figure 10:
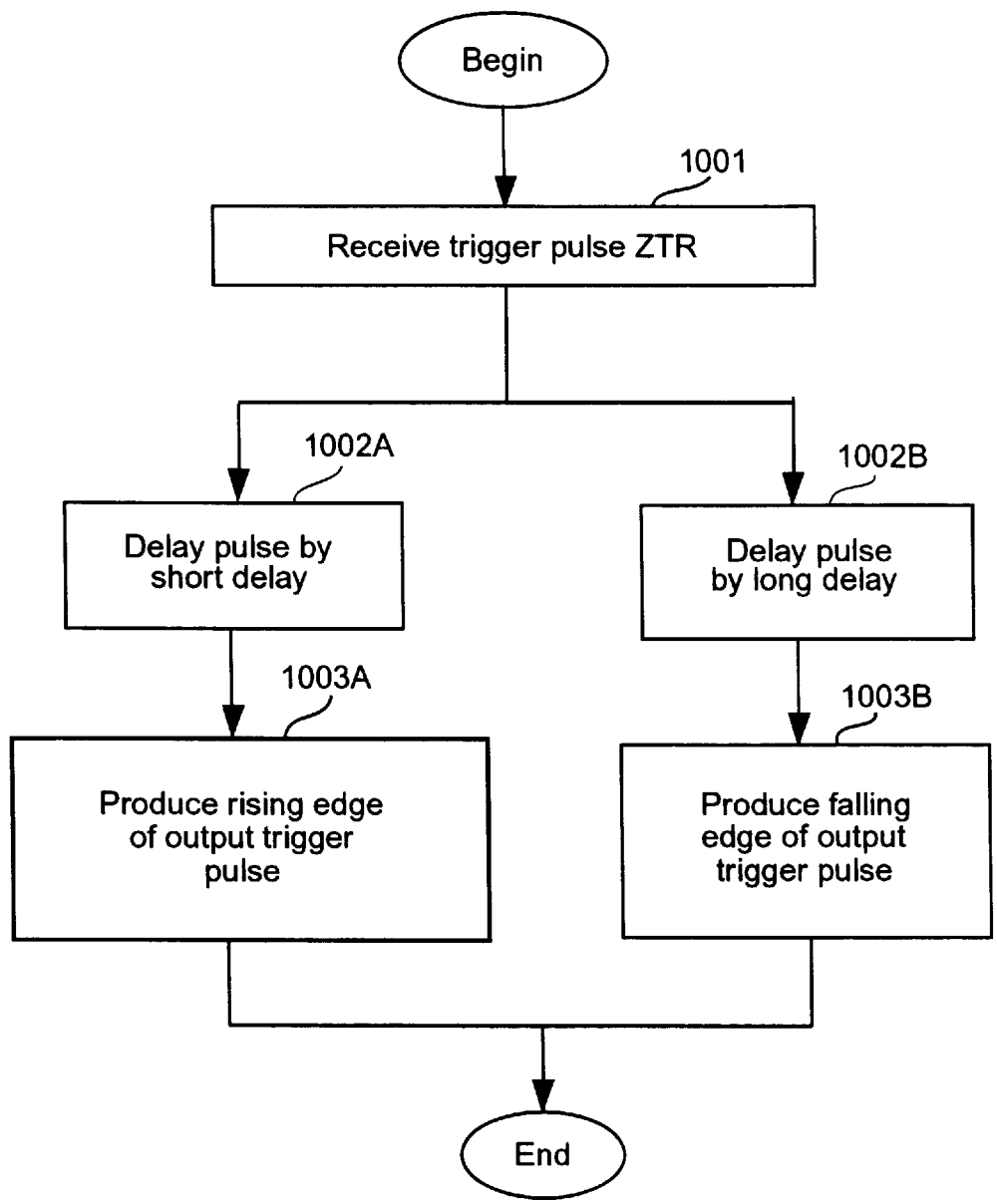
FIG. 10 is a flow diagram illustrating a routine by which the trigger pulse generation circuitry generates trigger pulses.

FIG. 10 illustrates a routine that can be implemented within the pulse generation circuitry during an imaging session. Initially, a trigger pulse ZTR is received at 1001. The trigger pulse ZTR is delayed by a short duration delay, such as delay $T_2$, at 1002A. Concurrently with 1002A, the trigger pulse ZTR is delayed by a longer duration delay, such as programmable delay $T_1$, at 1002B. In response to the trigger pulse delayed by the short delay, a rising edge of the output trigger pulse TR is produced at 1003A. The falling edge of the output trigger pulse TR is produced at 1003B in response to the trigger pulse ZTR delayed by the longer duration delay.

Figure 11:
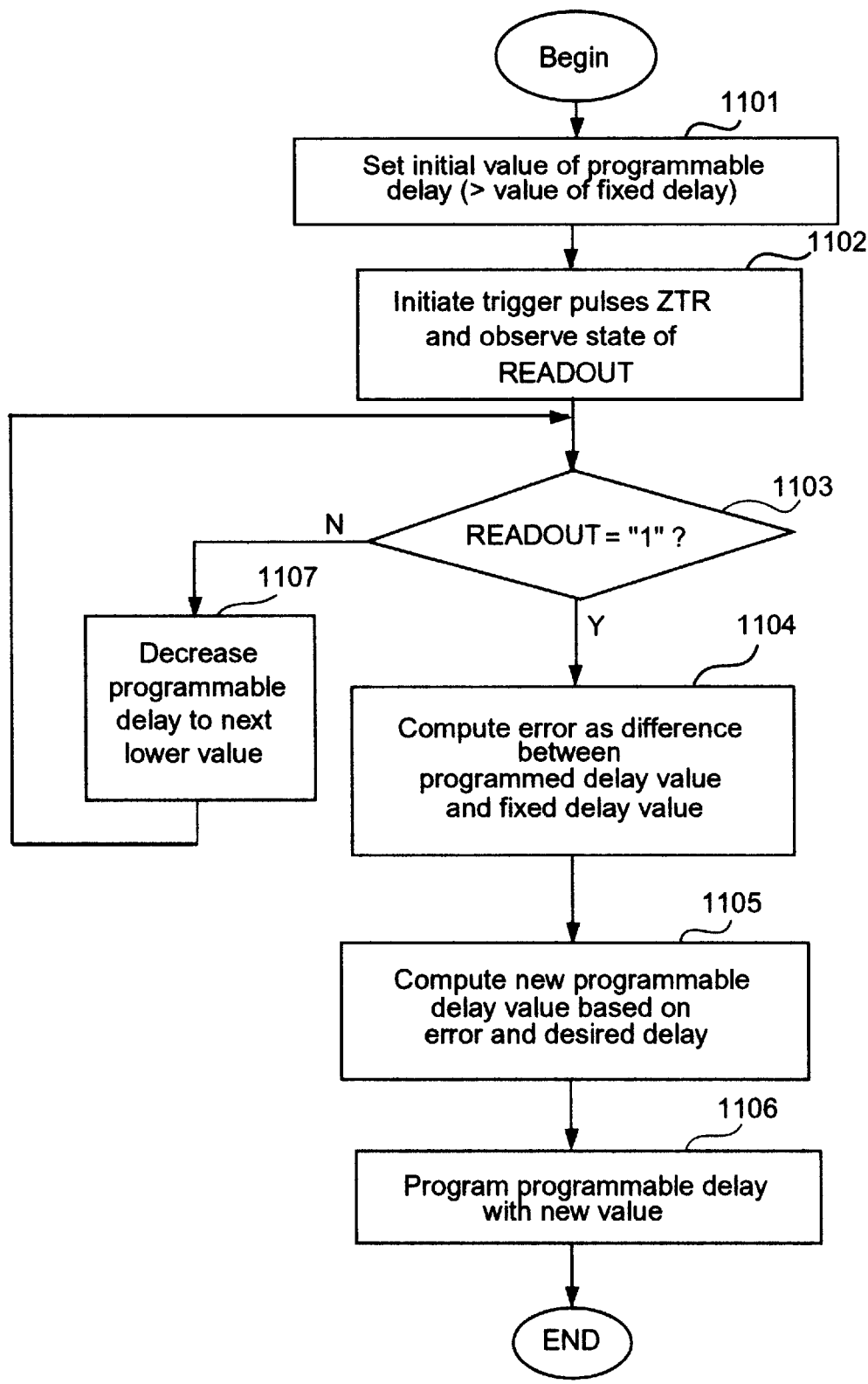
FIG. 11 is a flow diagram illustrating a routine for calibrating the programmable delay of the trigger pulse generation circuitry.

FIG. 11 illustrates a routine by which the pulse generation circuit of FIG. 7A or 7B can be operated to calibrate the programmable delay 62. At 1101, the initial delay value $T_1$ of programmable delay element 62 is programmed. As noted above, this initial value is set to some value that is known to be greater than the delay value of fixed delay element 71. Next, at 1102, trigger pulses ZTR are initiated, and the state of the READOUT signal is observed. For purposes of this routine, the trigger pulses ZTR may be artificially generated, rather than being based on actual scintillation events. At 1103, if the READOUT signal is determined to be asserted, then at 1104 the error of programmable delay element 62 is computed as the difference between the programmed delay value and the delay value of fixed delay element 71. Following 1104, a new programmable delay value is computed at 1105 based on the computed error and the desired delay, i.e., as the desired delay plus or minus the computed error, as appropriate. Next, at 1106, the programmable delay 62 is programmed with the new delay value, and the routine ends. If the READOUT signal is determined not to be asserted at 1103, then at 1107 the programmable delay value $T_1$ is decreased to the next lower programmable step, while trigger pulses ZTR continue to be applied. Following 1107, the routine continues from 1103.

Thus, a method and apparatus for calibrating a programmable delay in a timing circuit of a gamma camera detector have been described. Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative sense rather than a restrictive sense.

What is claimed is:

1. An apparatus for calibrating a delay, the apparatus comprising:

a first delay element configured to delay an input signal by a first delay, the first delay having an error;

a calibration unit coupled to the first delay element and configured to delay the input signal by a second delay, the second delay having an error substantially less than the error of the first delay, the calibration unit further configured to provide a predetermined signal at an output in response to a coinciding of an assertion of the input signal delayed by the first delay with an assertion of the input signal delayed by the second delay; and a control unit coupled to the calibration unit and configured to determine a value corresponding to the error of the first delay based on the output.

2. An apparatus according to claim 1, wherein the calibration unit comprises:

a second delay element configured to delay the input signal by the second delay;

a decision unit coupled to the second delay element and configured to provide the predetermined signal at the output in response to the coinciding of the assertion of the input signal delayed by the first delay with the assertion of the input signal delayed by the second delay.

3. An apparatus according to claim 1, wherein the control unit is further configured to modify the first delay based on the output.

4. An apparatus according to claim 3, wherein the control unit is configured to further modify the first delay based on the value corresponding to the error to cause the first delay to equal a desired delay.

5. A gamma camera system comprising:

a processing system; and a radiation detector coupled to the processing system, the radiation detector including the apparatus for calibrating a delay of claim 1, wherein the radiation detector generates the input signal.

6. An apparatus for measuring an error of a delay, the apparatus comprising:

first delay means for receiving a first signal and for outputting the first signal according to a first delay, the first delay having an error;

second delay means for receiving the first signal and for outputting the first signal according to a second delay, the second delay having an error substantially less than the error of the first delay;

decision means for outputting a predetermined signal in response to an assertion of an output of the first means coinciding with an assertion of an output of the second means;

adjusting means for adjusting the value of the first delay; and determining means for determining a value corresponding to the error of the first delay based on the predetermined signal.

7. A gamma camera system comprising:

a processing system;

a coincidence detection unit; and a plurality of radiation detectors coupled to the processing system and to the coincidence detection unit, each of the radiation detectors including a timing circuit configured to provide a trigger pulse to the coincidence detection unit in response to a radiation-induced event, each of the timing circuits including the apparatus of claim 6, where the radiation detector detects a radiation-induced event and generates said first signal.

8. A circuit for measuring the length of a delay, the circuit comprising:

a first delay element receiving an input signal and having an output, the first delay element configured to output a change in state at the output in response to a change in state of the input signal after a first delay, the first delay element receiving a programming signal for programming a value of the first delay, the first delay having an error;

a second delay element receiving the input signal and having an output, the second delay element configured to output a change in state at the output of the second delay element in response to the change in state of the input signal after a second delay, wherein the second delay has an error substantially less than the error of the first delay;

a flip-flop having a data input and a clock input, the flip-flop coupled to receive the output of the first delay element at the data input and coupled to receive the output of the second delay element at the clock input, the flip-flop having an output; and a control circuit receiving the output of the flip-flop and outputting the programming signal, the control circuit configured to generate the programming signal to adjust the value of the first delay to cause the output of the flip-flop to change to a predetermined state, the control circuit further configured to determine the error of the first delay based on the output of the flip-flop, the control circuit further configured to generate the programming signal to further adjust the value of the first delay to obtain a desired delay based on the error of the first delay.

9. A gamma camera system comprising:

a processing system; and a radiation detector coupled to the processing system, the radiation detectors including a timing circuit configured to generate a trigger pulse in response to a radiation-induced event, the timing circuit including the circuit of claim 8.

10. A circuit for precisely measuring the length of an imprecise delay, the circuit comprising:

a programmable delay element having an input coupled to receive an input signal and having an output, the programmable delay element configured to output a change in state at the output in response to a change in state of the input signal after a first delay, the programmable delay element further coupled to receive a programming signal for programming a value of the first delay, the first delay having an error;

a precision delay element having an input coupled to receive the input signal and having an output, the precision delay element configured to output a change in state at the output of the precision delay element in response to the change in state of the input signal after a second delay, wherein the second delay has an error substantially less than the error of the first delay;

a flip-flop having a data input and a clock input, the flip-flop coupled to receive the output of the programmable delay element at the data input and coupled to receive the output of the precision delay element at the clock input, the flip-flop having an output; and a control circuit coupled to receive the output of the flip-flop and coupled to output the programming signal to the programmable delay element, the control circuit configured to generate the programming signal so as to adjust the value of the first delay based on the output of the flip-flop to cause the output of the flip-flop to change to a predetermined value, the control circuit further configured to output a value corresponding to the error of the first delay.

11. A gamma camera system comprising the circuit of claim 10.

12. A timing circuit for generating an output pulse in response to an input pulse, the timing circuit comprising:

a first delay element configured to generate a first delayed signal based on the input pulse and a first delay, the first delay having an error, the first delay element coupled to receive a programming signal for programming a value of the first delay;

an output circuit configured to generate a first edge of the output pulse based on the input pulse and configured to generate a second edge of the output pulse based on the first delayed signal;

a calibration unit configured to generate a second delayed signal based on the input pulse and a second delay, the second delay having an error substantially less than the error of the first delay, the calibration unit further configured to generate a predetermined signal in response to a coinciding of the first delayed signal with the second delayed signal; and a control circuit coupled to receive the predetermined signal and configured to determine a value corresponding to the error of the first delay in response to the predetermined signal, the control circuit further configured to provide the programming signal to further adjust the value of the first delay to obtain a desired delay based on the error of the first delay.

13. A timing circuit according to claim 12, wherein the calibration unit comprises:

a second delay element configured to generate the second delayed signal; and a flip-flop coupled to receive the first delayed signal and the second delayed signal and configured to output the predetermined signal.

14. A gamma camera system comprising:

a processing system;

a plurality of radiation detectors coupled to the processing system, each of the radiation detectors including a timing circuit according to claim 12, where each of the radiation detector detects a radiation-induced event and generates the input pulse to the timing circuit.

15. A gamma camera system comprising:

a gantry;

a processing system; and a plurality of radiation detectors supported by the gantry and coupled to the processing system, each of the radiation detectors including means for outputting a trigger pulse in response to a radiation-induced event, each said means for providing a trigger pulse including:

means for generating an input trigger signal in response to a radiation-induced event;

means for delaying the input trigger signal according to a first delay;

means for delaying the input trigger signal according to a second delay, the second delay having an error;

means for delaying the input trigger signal according to a third delay, the third delay having an error substantially less than the error of the second delay;

means for generating a predetermined signal in response to a coinciding of an assertion of the input trigger signal delayed by the second delay with an assertion of the input trigger signal delayed the third delay; and means for setting the second delay based on the predetermined signal;

means for generating the trigger pulse based on the input trigger signal delayed by the first delay and the input trigger signal delayed the second delay.

16. A gamma camera system comprising:
a gantry;
a processing system;
a coincidence detection unit; and
a plurality of radiation detectors supported by the gantry and coupled to the processing system and to the coincidence detection unit, each of the radiation detectors including means for providing a trigger pulse to the coincidence detection unit in response to a radiation-induced event, each said means for providing a trigger pulse including:
  means for generating an input trigger signal in response to a radiation-induced event;
  means for delaying the input trigger signal according to a first delay;
  means for delaying the input trigger signal according to a second delay, the second delay having an error;
  means for delaying the input trigger signal according to a third delay, the third delay having an error substantially less than the error of the second delay;
  means for generating a predetermined signal in response to a coinciding of an assertion of the input trigger signal delayed by the second delay with an assertion of the input trigger signal delayed the third delay;
  means for computing the error of the second delay based on a generation of the predetermined signal;
  means for adjusting the second delay based on the computed error of the second delay; and
  means for generating the trigger pulse based on the input trigger signal delayed by the first delay and the input trigger signal delayed the second delay.

17. A method of calibrating a delay, the method comprising:
  delaying an input signal by a first delay to produce a first delayed signal, wherein the first delay has an error;
  delaying the input signal by a second delay to produce a second delayed signal, wherein the second delay has an error substantially less than the error of the first delay;
  generating a predetermined signal corresponding to a timing error between the first delayed signal and the second delayed signal;
  adjusting the first delay based on the predetermined signal.

18. The method of claim 17, wherein said delaying the input signal according to the first delay comprises delaying the input signal according to the first delay at least partially concurrently with said delaying the input signal according to the second delay.

19. The method of claim 18, wherein the input signal is based on a radiation-induced event, the method further comprising:
  using the first delayed signal and the second delayed signal to generate a trigger signal; and
  using the trigger signal to detect the radiation-induced event.

20. A method of calibrating a delay, the method comprising:
  delaying an input signal by a first delay, the first delay having a error;
  delaying the input signal by a second delay, the second delay having a error substantially less than the error of the first delay, wherein said delaying the input signal by the first delay is at least partially concurrent with said delaying the input signal by the second delay;
  generating a predetermined signal indicative of the presence or lack of a timing error between the input signal delayed by the first delay and the input signal delayed by the second delay;
  adjusting the first delay until the predetermined signal indicates the lack of a timing error between the input signal delayed by the first delay and the input signal delayed by the second delay; and
  further adjusting the first delay in response to said adjusting the first delay until the predetermined signal indicates the lack of a timing error between the input signal delayed by the first delay and the input signal delayed by the second delay.

21. The method of claim 20, wherein the input signal is based on a radiation-induced event, the method further comprising:
  using the input signal delayed by the first delay and the input signal delayed by the second delay to generate a trigger signal; and
  using the trigger signal to detect a coincidence between the radiation-induced event and a second radiation-induced event.

22. The method of claim 20, further comprising:
  delaying the input signal by a third delay, the third delay having a error substantially less than the error of the first delay;
  generating a second predetermined signal corresponding to an error between the input signal delayed by the first delay and the input signal delayed by the third delay; and
  adjusting the first delay based on the second predetermined signal.

23. A method of operating a radiation detection system, the method comprising:
  generating a first input trigger signal;
  delaying the first input trigger signal according to a first delay, the first delay having a error;
  delaying the first input trigger signal according to a second delay, the second delay having a error substantially less than the error of the first delay;
  generating a predetermined signal corresponding to a timing error between the first input trigger signal delayed by the first delay and the first input trigger signal delayed the second delay;
  computing a value of the timing error in response to the predetermined signal;
  setting the first delay based on the computed value of the timing error;
  generating a second input trigger signal in response to a radiation-induced event;
  delaying the second input trigger signal according to the second delay;
  delaying the second input trigger signal according to a third delay;
  generating an output trigger pulse based on the second input trigger signal delayed by the second delay and the second input trigger signal delayed the third delay; and
  recording a radiation-induced event based on the output trigger pulse.

24. The method of claim 23, further comprising using the output trigger pulse to detect a coincidence between the radiation-induced event and a second radiation-induced event.

* * * * *